(12) United States Patent
Johnescu et al.

(10) Patent No.: US 9,437,947 B2
(45) Date of Patent: Sep. 6, 2016

(54) ELECTRICAL CONNECTOR HAVING HOLD DOWN MEMBER

(71) Applicants: Douglas M. Johnescu, York, PA (US);
Gregory A. Hull, York, PA (US)

(72) Inventors: Douglas M. Johnescu, York, PA (US);
Gregory A. Hull, York, PA (US)

(73) Assignee: FCI Americas Technology LLC, Carson City, NV (US)

( * ) Notice: Subject to any disclaimer, the term of this patent is extended or adjusted under 35 U.S.C. 154(b) by 50 days.

(21) Appl. No.: 14/547,497

(22) Filed: Nov. 19, 2014

(65) Prior Publication Data

US 2015/0147910 A1    May 28, 2015

Related U.S. Application Data

(60) Provisional application No. 61/909,823, filed on Nov. 27, 2013.

(51) Int. Cl.
| | |
|---|---|
| *H01R 13/60* | (2006.01) |
| *H01R 12/70* | (2011.01) |
| *H05K 3/30* | (2006.01) |
| *H01R 12/72* | (2011.01) |
| *H01R 13/518* | (2006.01) |

(52) U.S. Cl.
CPC .......... *H01R 12/7047* (2013.01); *H05K 3/306* (2013.01); *H01R 12/724* (2013.01); *H01R 13/518* (2013.01); *H05K 2201/10295* (2013.01); *H05K 2201/10409* (2013.01); *H05K 2201/10446* (2013.01); *H05K 2201/10598* (2013.01); *Y10T 29/49147* (2015.01)

(58) Field of Classification Search
CPC ............ H01R 12/7047; H01R 12/724; H01R 13/518; H05K 3/306; H05K 2201/10295; Y10T 29/49147
USPC ................... 439/79, 564, 573, 574
See application file for complete search history.

(56) References Cited

U.S. PATENT DOCUMENTS

| | | |
|---|---|---|
| 4,911,659 A | 3/1990 | Viselli |
| 5,044,988 A | 9/1991 | Hirayama |
| 5,346,404 A | 9/1994 | Shimada |
| 5,451,158 A | 9/1995 | Lin et al. |
| 6,086,418 A | 7/2000 | Chang |
| 7,331,800 B2 | 2/2008 | Winings et al. |
| 7,442,047 B1 | 10/2008 | Schmidgall |
| 2006/0199430 A1 | 9/2006 | Northey |
| 2013/0017734 A1 | 1/2013 | Masumoto et al. |
| 2013/0273781 A1 | 10/2013 | Buck et al. |

FOREIGN PATENT DOCUMENTS

| | | |
|---|---|---|
| JP | 2005/141942 | 6/2005 |
| JP | 2011/060598 | 3/2011 |

*Primary Examiner* — Khiem Nguyen
(74) *Attorney, Agent, or Firm* — Wolf, Greenfield & Sacks, P.C.

(57) ABSTRACT

An electrical connector include a movable hold down member that is configured to receive a fastener so as to secure the electrical connector to an underlying substrate to which the electrical connector is mounted.

17 Claims, 13 Drawing Sheets

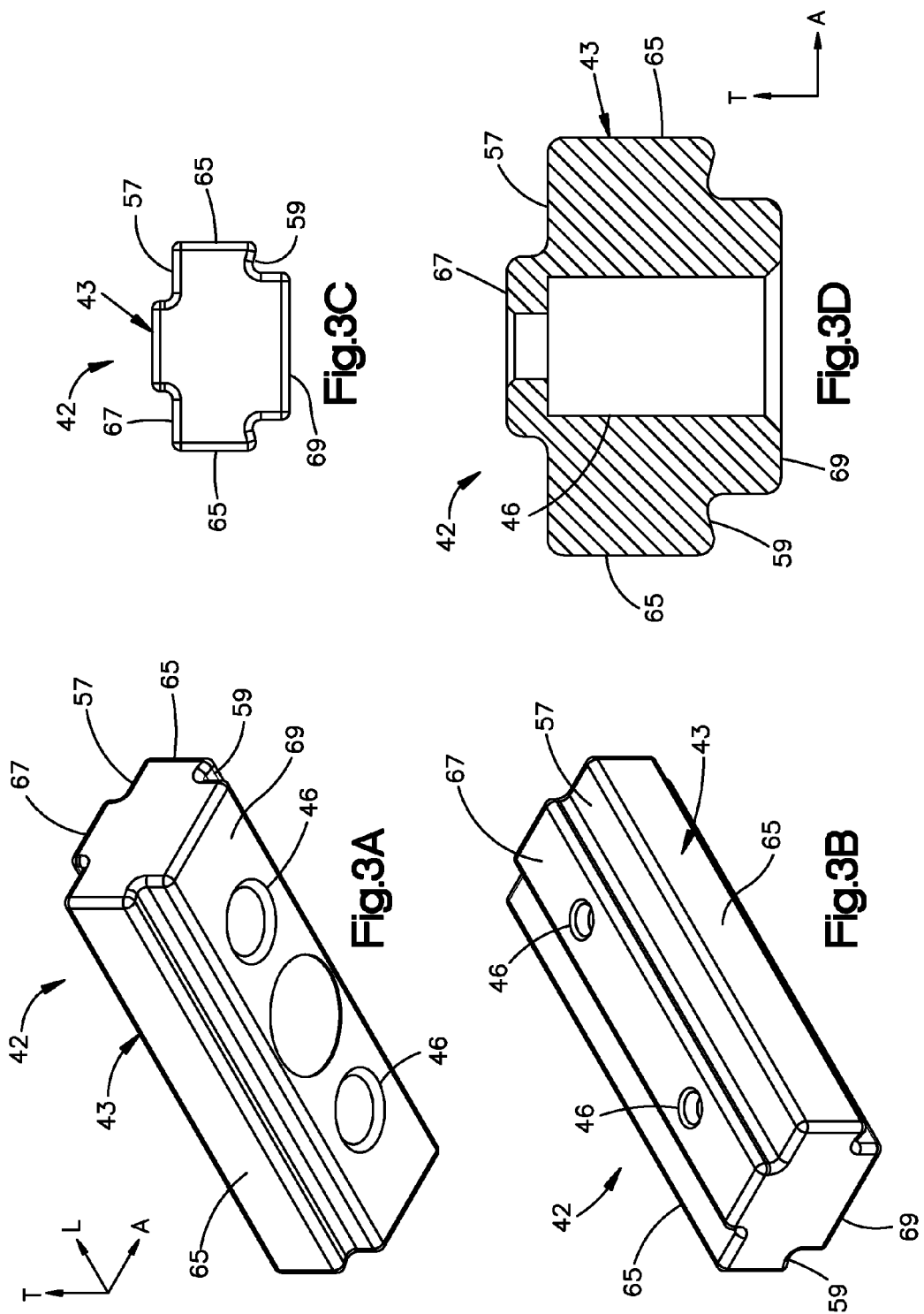

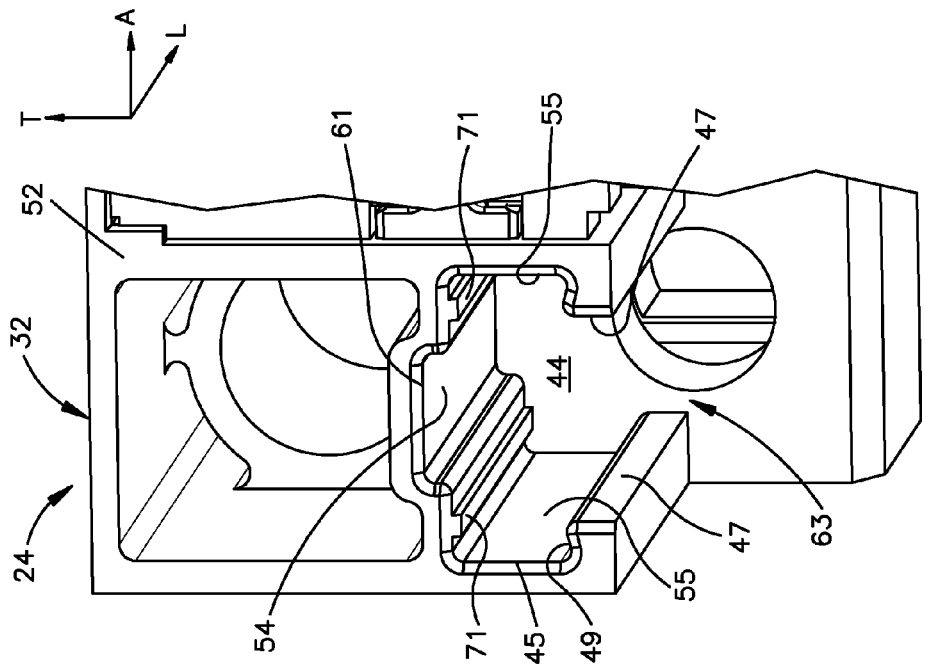
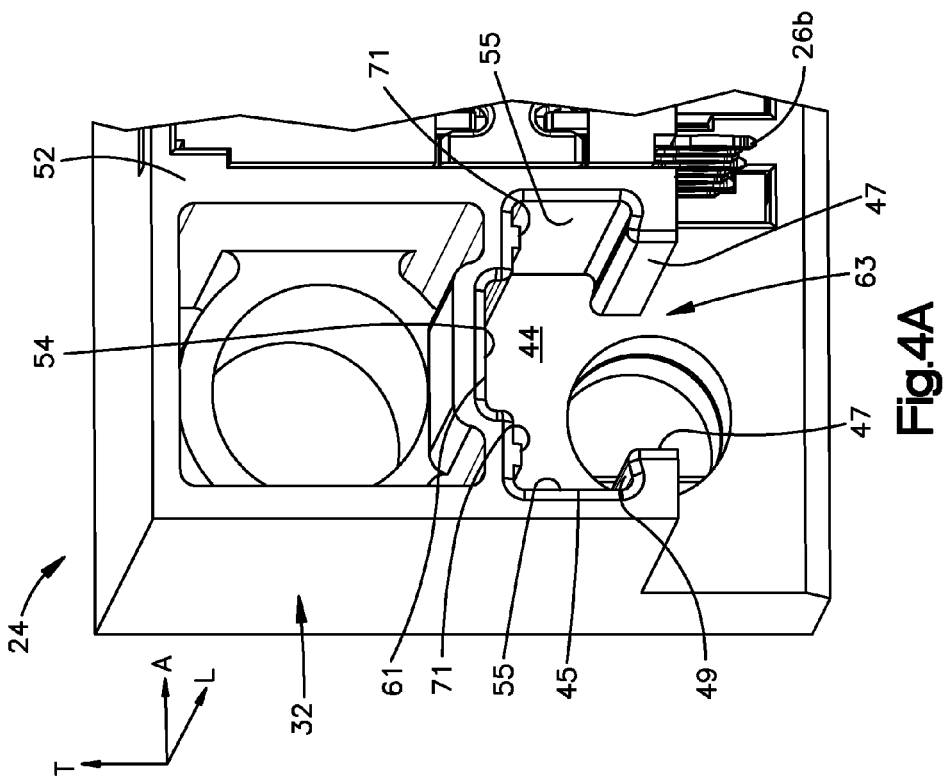

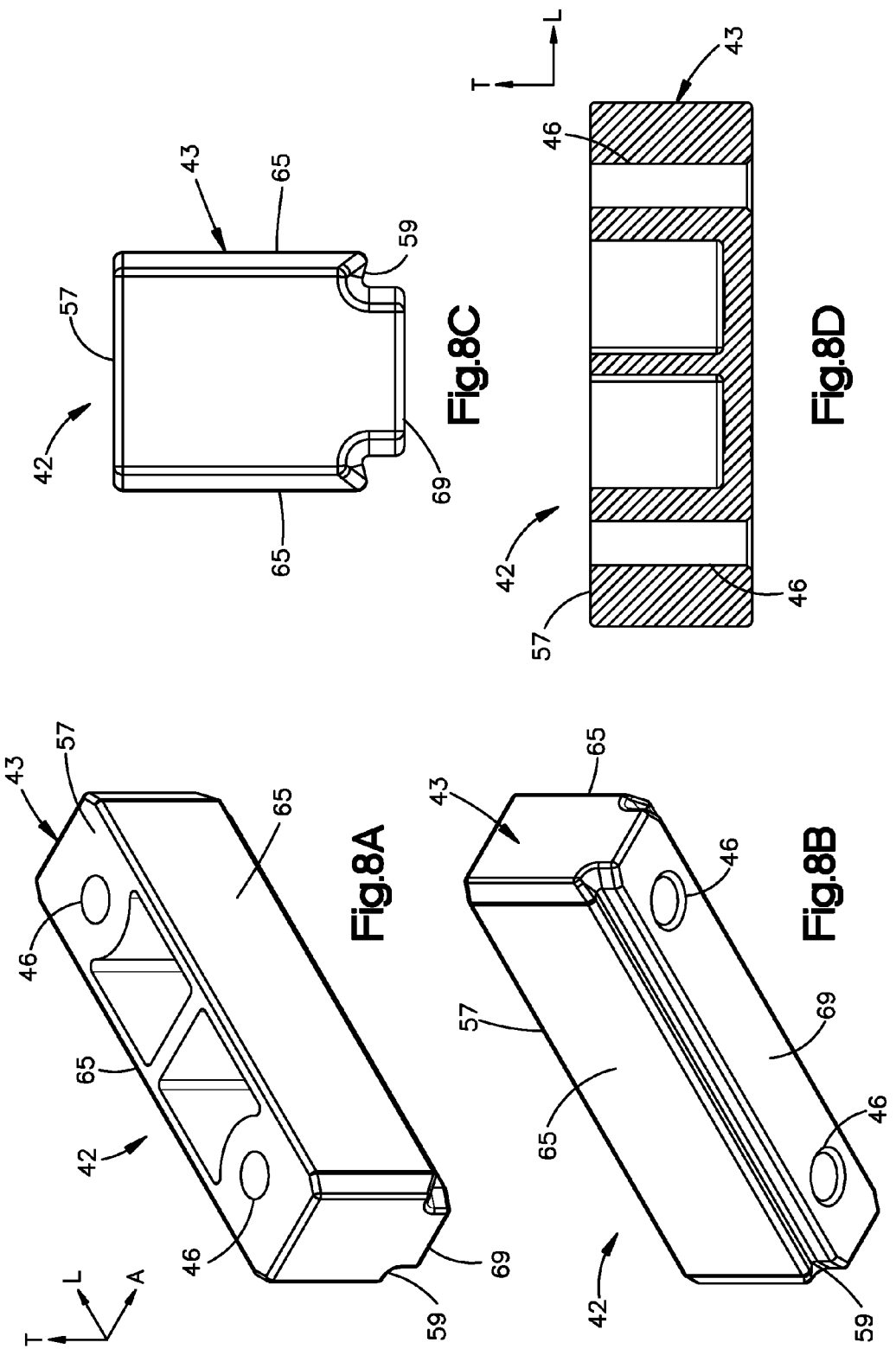

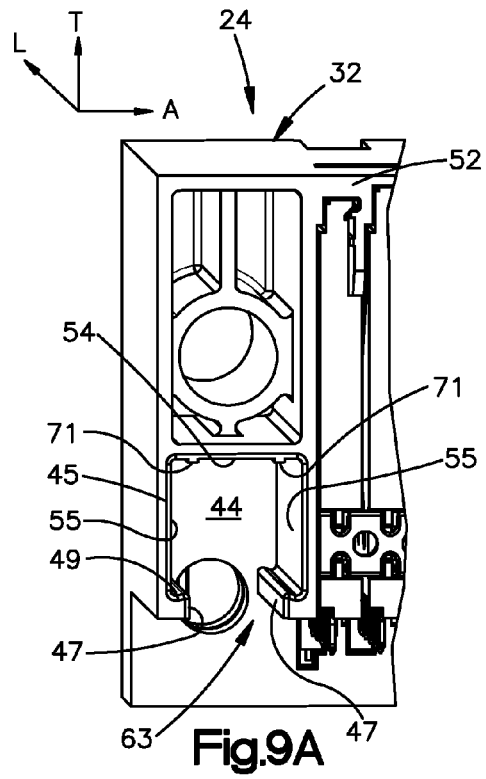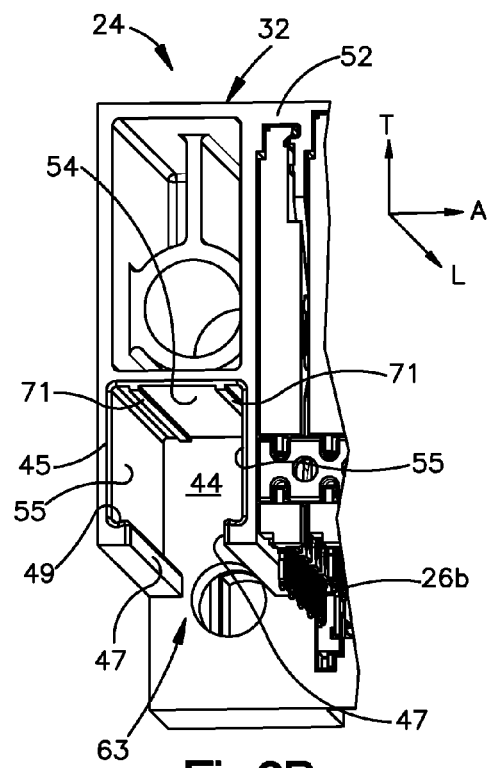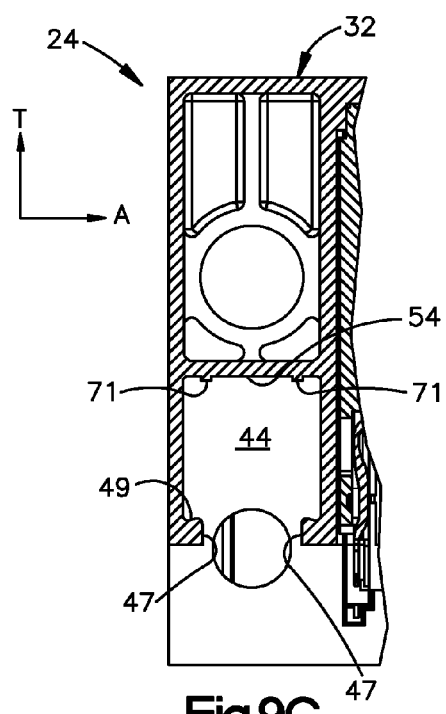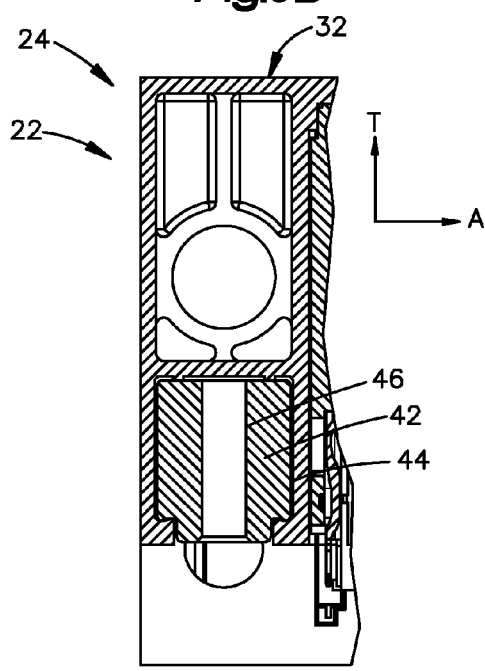

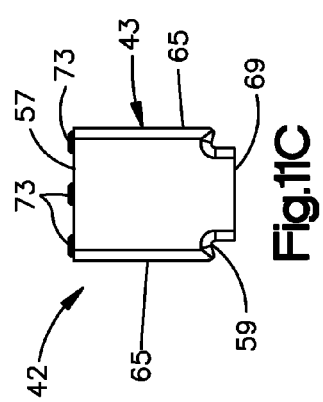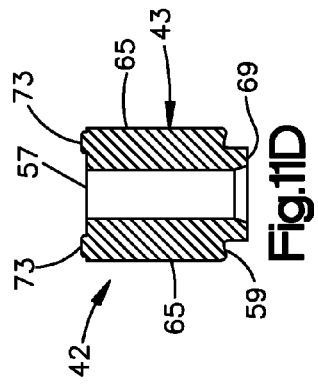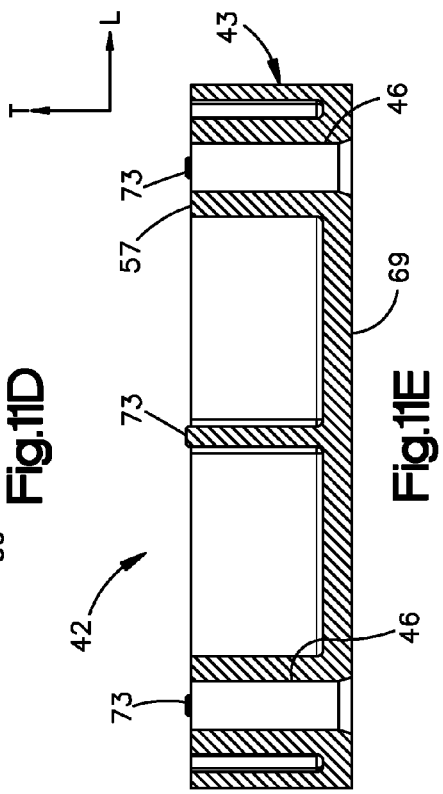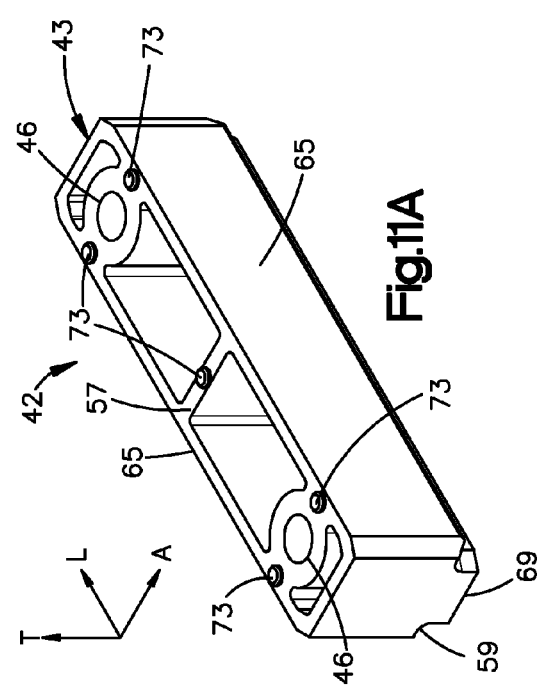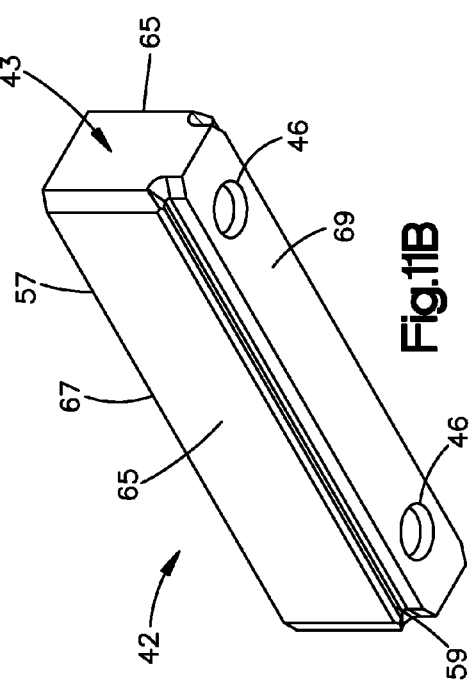

ELECTRICAL CONNECTOR HAVING HOLD DOWN MEMBER

CROSS-REFERENCE TO RELATED APPLICATIONS

This claims the benefit of U.S. patent application Ser. No. 61/909,823, filed on Nov. 27, 2013, the disclosure of which is hereby incorporated by reference as if set forth in its entirety herein.

BACKGROUND

Electrical connectors provide data signal and power connections between electronic devices using electrically-conductive contacts. Electrical connectors can be mated to a complementary electronic device and mounted to a substrate, such as a printed circuit board, to facilitate the transfer of data signal or power between the substrate and the complementary electronic device.

SUMMARY

In accordance with one embodiment, an electrical connector includes a dielectric connector housing having a housing body, the housing defining a channel that extends into the housing body. The electrical connector further includes a plurality of electrical contacts supported by the housing body such that the electrical contacts define respective mating portions and mounting portions opposite the mating portions. The mating portions are configured to mate with complementary electrical contacts of a complementary electrical component, and the mounting portions are configured to be placed in electrical communication with a substrate when the electrical connector is mounted to the substrate. The electrical connector further includes a hold down member including a hold down body and at least one aperture that extends at least into the hold down body. The hold down member is slidably positioned in the channel between a first position whereby the aperture is out of alignment with a complementary aperture in the substrate, and a second position whereby the aperture is in alignment with the complementary aperture. When the hold down member is in the second position, at least one fastener is insertable through the aperture in the substrate and into the at least one aperture of the hold down member so as to secure the connector housing to the substrate.

BRIEF DESCRIPTION OF THE DRAWINGS

The foregoing summary, as well as the following detailed description of example embodiments of the application, will be better understood when read in conjunction with the appended drawings. For the purposes of illustrating the electrical connector system of the present application, there is shown in the drawings example embodiments. It should be understood, however, that the application is not limited to the precise arrangements and instrumentalities shown. In the drawings:

FIG. 3A is a perspective view of the hold down member illustrated in FIG. 2;

FIG. 3B is another perspective view of the hold down member illustrated in FIG. 3A;

FIG. 3C is an end elevation view of the hold down member illustrated in FIG. 3A;

FIG. 3D is a sectional end elevation view of the hold down member illustrated in FIG. 3C;

FIG. 4A is a perspective view of a portion of the electrical connector illustrated in FIG. 1A, showing a channel configured to receive the hold down member;

FIG. 4B is another perspective view of a portion of the electrical connector illustrated in FIG. 1A, showing the channel;

FIG. 8A is a perspective view of a hold down member of the electrical connector illustrated in FIG. 7;

FIG. 8B is another perspective view of the hold down member illustrated in FIG. 8A;

FIG. 8C is an end elevation view of the hold down member illustrated in FIG. 8B;

FIG. 8D is a sectional side elevation view of the hold down member illustrated in FIG. 8C;

FIG. 9A is a perspective view of a portion of the electrical connector illustrated in FIG. 7, showing a channel configured to receive the hold down member;

FIG. 9B is another perspective view of a portion of the electrical connector illustrated in FIG. 9A, showing the channel;

FIG. 9C is a sectional end elevation view of a portion of the electrical connector, showing the channel illustrated in FIG. 9B;

FIG. 9D is a sectional end elevation view of a portion of the electrical connector, showing the hold down member inserted into the channel illustrated in FIG. 9C;

FIG. 11A is a perspective view of a hold down member of the electrical connector illustrated in FIG. 10;

FIG. 11B is another perspective view of the hold down member illustrated in FIG. 11A;

FIG. 11C is an end elevation view of the hold down member illustrated in FIG. 10B;

FIG. 11D is a sectional end elevation view of the hold down member illustrated in FIG. 11C;

FIG. 11E is a sectional side elevation view of the hold down member illustrated in FIG. 11D;

DETAILED DESCRIPTION

Figure 1A:
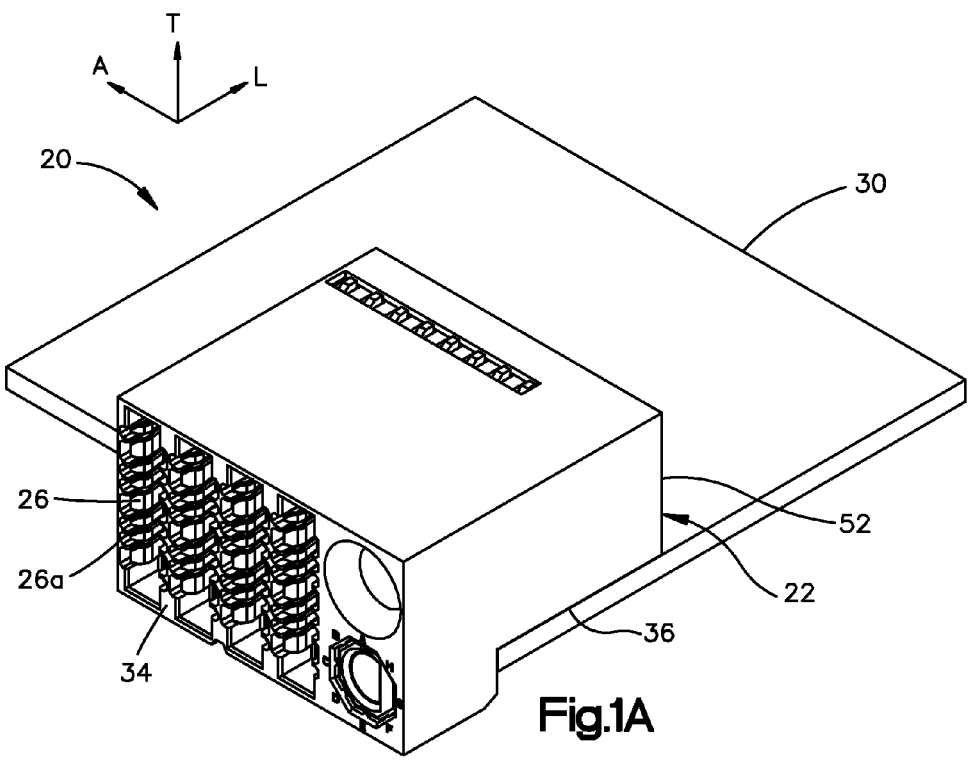
FIG. 1A is a perspective view of an electrical connector assembly that includes an electrical connector and a substrate.
Figure 1B:
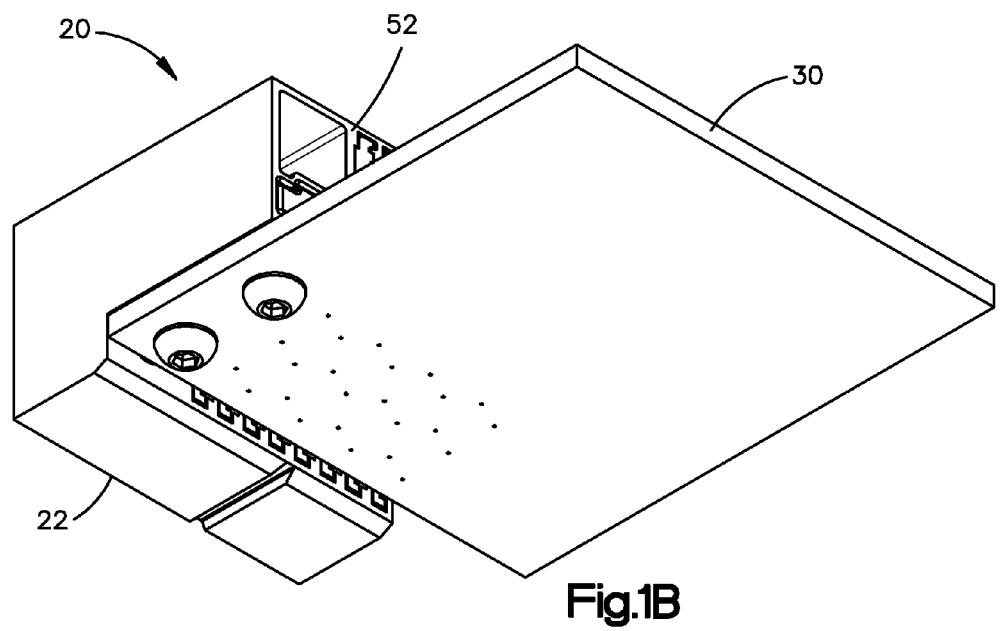
FIG. 1B is another perspective view of the electrical connector assembly illustrated in FIG. 1A.
Figure 2:
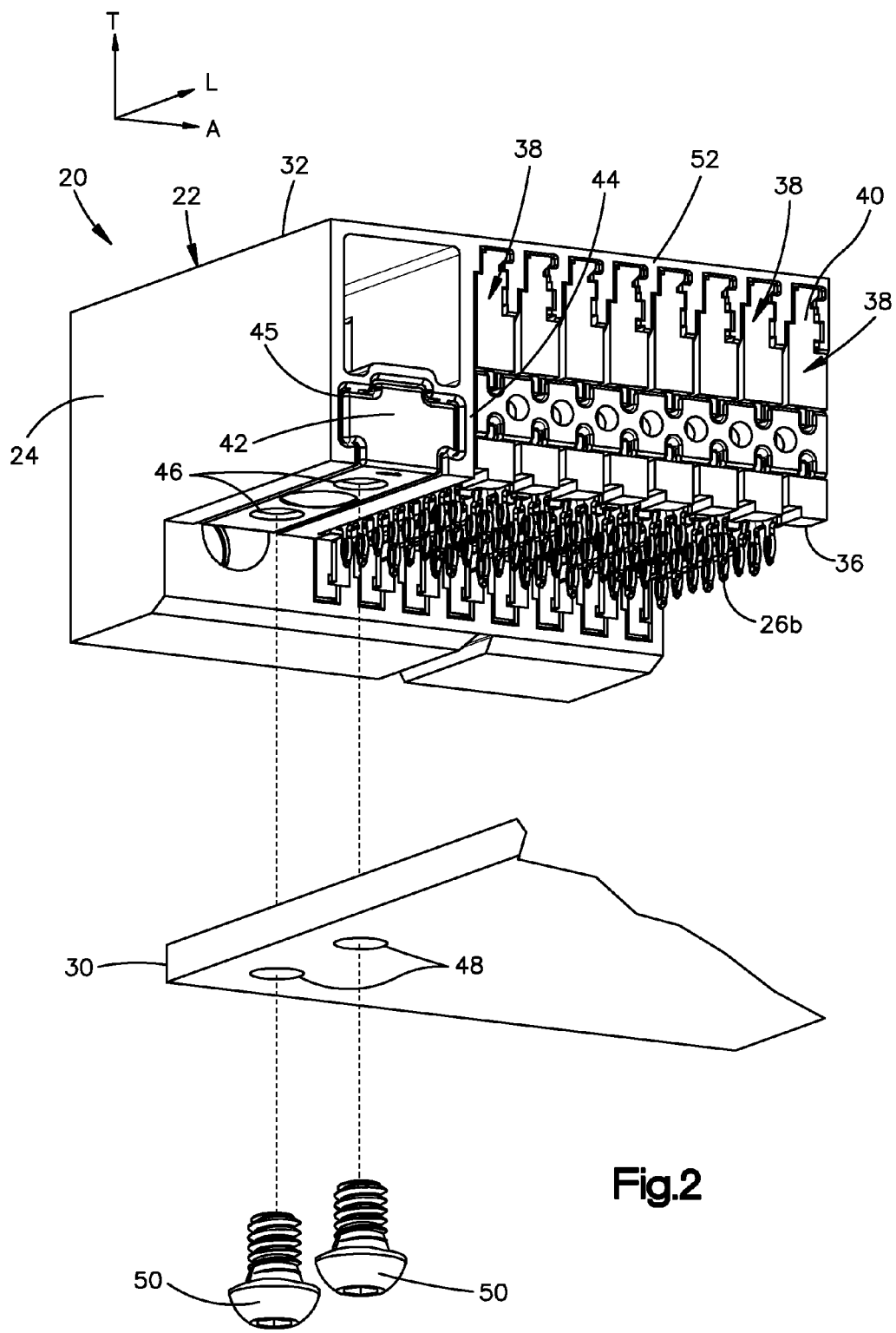
FIG. 2 is an exploded perspective view of the electrical connector assembly illustrated in FIG. 1A, further including a fastener configured to secure the substrate to a hold down member of the electrical connector.
Figure 4C:
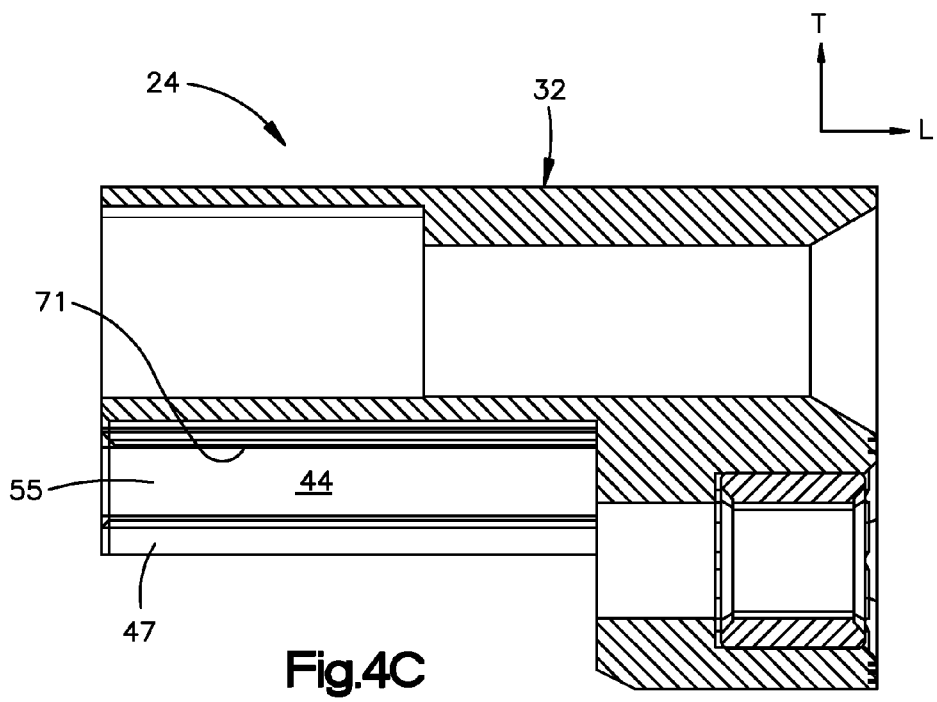
FIG. 4C is a sectional side elevation view of a portion of the electrical connector illustrated in FIG. 1A, showing the channel.
Figures 4D, 4E:
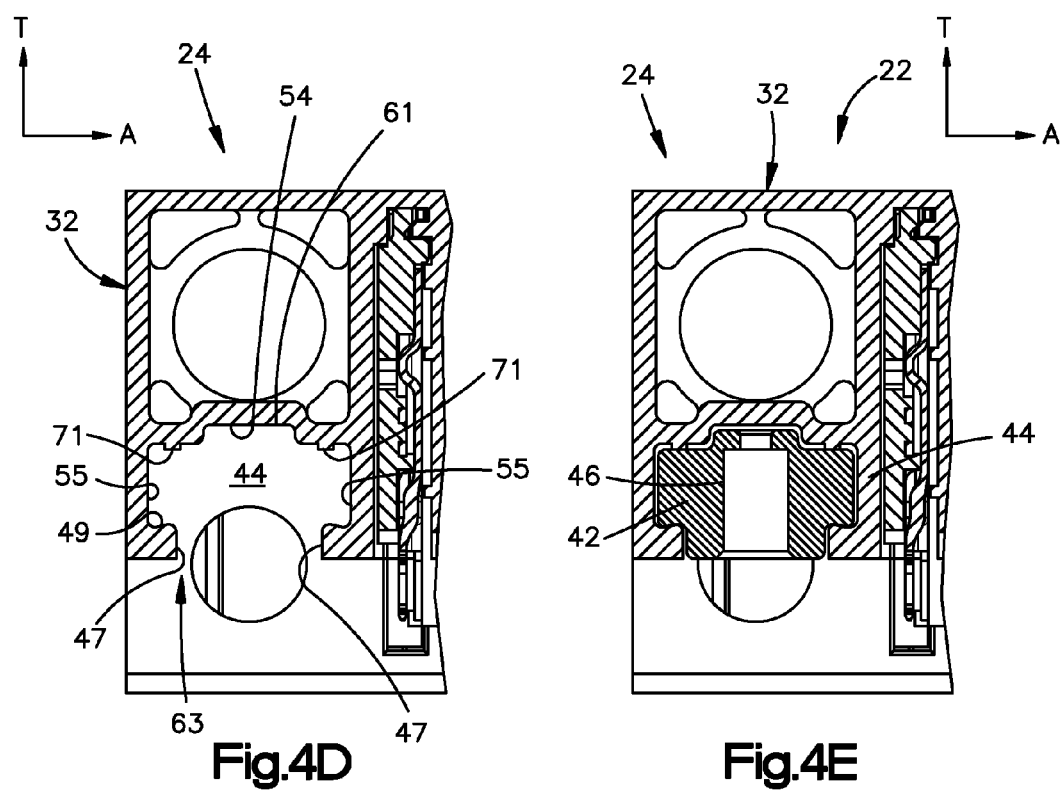
FIG. 4D is a sectional end elevation view of a portion of the electrical connector, showing the channel.
FIG. 4E is a sectional end elevation view of a portion of the electrical connector, showing the hold down member inserted into the channel.

Referring to FIGS. 1A-2, an electrical connector assembly 20 includes an electrical connector 22 and a substrate 30. The substrate 30 can be configured as a printed circuit board. The electrical connector 22 is configured to be mounted to the substrate 30, and mated to a complementary electrical component, such as a complementary electrical connector. When the electrical connector 22 is mated to the complementary electrical component and mounted to the substrate 30, the substrate is placed in electrical communication with the complementary electrical component through the electrical connector 22. The electrical connector 22 includes a dielectric or electrically insulative connector housing 24 and a plurality of electrical contacts 26 supported by the connector housing 24. The electrical contacts 26 are configured to mate with complementary electrical contacts of the complementary electrical component, and are further configured to be mounted to the substrate 30. The electrical connector 22 further includes a hold down member 42 that is configured to secure the electrical connector 22 to the substrate 30. For instance, the hold down member 42 is configured to be supported by the connector housing 24. The electrical connector assembly 20 can further include at least one fastener that is configured to secure the substrate 30 to the hold down member 42, thereby securing the substrate 30 to the electrical connector 22. The hold down member 42, and all hold down members described herein, can be made from any suitable material as desired, such as plastic as only one example. The hold down member 42, and all hold down members described herein, can be die cast, or can be fabricated using any suitable alternative manufacturing process. In one example, the hold down member 42, and all hold down members described herein, can be zinc die cast.

Various structures are described herein as extending horizontally along a first or longitudinal direction "L" and a second or lateral direction "A" that is substantially perpendicular to the longitudinal direction L, and vertically along a third or transverse direction "T" that is substantially perpendicular to each of the longitudinal direction L and the lateral directions A. As illustrated, the electrical connector 22 can be mated to the complementary electrical component in a forward mating direction, and unmated from each other along a rearward direction, both the forward and rearward directions being along the longitudinal direction L. Thus, unless otherwise specified herein, the terms "lateral," "longitudinal," and "transverse" are used to describe the orthogonal directional components of various components. Further, the term "in" when used with a specified direction component is intended to refer to the single specified direction, and the term "along" when used with a specified direction component is intended to refer to either or both of opposed directions. It should be appreciated that while the longitudinal and lateral directions are illustrated as extending along a horizontal plane, and that while the transverse direction is illustrated as extending along a vertical plane, the planes that encompass the various directions may differ during use, depending, for instance, on the orientation of the various components. Accordingly, the directional terms "vertical" and "horizontal" are used to describe the electrical connector assembly 20 and its components as illustrated merely for the purposes of clarity and convenience, it being appreciated that these orientations may change during use.

The electrical contacts 26 can include electrical signal contacts, alone or in combination with electrical ground contacts, or can alternatively define electrical power contacts. Adjacent ones of the electrical contacts 26 configured as electrical signal contacts can define differential signal pairs, or the signal contacts can be single ended as desired. Each of the electrical contacts 26 can include a mating portion 26a and a mounting portion 26b opposite the mating portion 26a. The mating portions 26a can be oriented along a direction perpendicular with respect to the mounting portions 26b. Accordingly, the electrical contacts 26 can be referred to as right angle electrical contacts. For instance, the mating portions 26a can be oriented substantially along the longitudinal direction T, and the mounting portions 26b can be oriented substantially along the transverse direction T. Unless otherwise indicated herein, the connector housing 24 and the electrical contacts 26 can be constructed in any manner as desired, for instance as described in U.S. Pat. No. 7,331,800, and U.S. patent application Ser. No. 13/836,610 filed on Mar. 15, 2013, the disclosure of each of which is hereby incorporated by reference as if set forth in its entirety herein.

As described above, the substrate 30 can be configured as a printed circuit board that includes a plurality of electrical traces. The electrical connector 22 is configured to be mated to a complementary electrical component, such as a complementary electrical connector, so as to establish an electrical connection between the electrical connector 22 and the complementary electrical component. For instance, the mating portions 26a of the electrical contacts 26 are configured to mate with complementary electrical contacts of the complementary electrical component when the electrical connector 22 is mated with the complementary electrical component. The mating portions 26a can be configured as desired, for instance as plugs that are received by the complementary electrical contacts, or receptacles that receive the complementary electrical contacts. The electrical connector 22 can be configured to be mounted to the substrate 30 so as to place the electrical connector 22 and the substrate 30 in electrical communication with each other. For instance, the mounting portions 26b are configured to be placed in electrical communication with respective ones of the electrical traces of the substrate 30 when the electrical connector 22 is mounted to the substrate 30. Thus, the substrate 30 can be placed in electrical communication with the complementary electrical component when the electrical connector 22 is mounted to the substrate 30 and mated with the complementary electrical component.

The mounting portions 26b of the electrical contacts 26 can be configured as desired to be mounted to the underlying substrate 30 and can be configured to electrically connect to the substrate 30 at contact locations of the substrate 30. For instance, the mounting portions can be press-fit tails that are configured to be inserted, or press-fit, into respective vias of the substrate 30, thereby electrically connecting the mounting portions 26b and the corresponding electrical contacts 26 to respective electrical traces of the substrate 30 when the electrical connector 22 is mounted to the substrate 30. The vias can be configured as plated through-holes that electrically connect the mounting portions 26b to respective electrical traces of the underlying substrate 30. While the mounting portions 26b are configured as press-fit tails, it should be appreciated that the mounting portions can be configured to be placed in electrical communication with electrical traces of the substrate 30 in accordance with any suitable alternative embodiment. For instance, the mounting portions 26b can be surface mounted and configured to be fused, for instance soldered, to complementary contact pads of the substrate 30, so as to place the mounting portions 26b in electrical communication with the electrical traces.

The connector housing 24 includes a dielectric or electrically insulative housing body 32 that defines a mating interface 34 and a mounting interface 36. The mating interface 34 can be at least partially defined by a front surface of the housing body 32, and the mounting interface 36 can be at least partially defined by a bottom surface of the housing body 32. The mating interface 34 can be configured to receive, or be received by, or otherwise face, a housing of the complementary electrical component that supports the complementary electrical contacts when the electrical connector 22 is mated with the complementary electrical component. The mounting interface 36 is similarly configured to face the substrate 30 when the electrical connector 22 is mounted to the substrate 30. The mating portions of the electrical contacts 26 are disposed proximate to the mating interface, and the mounting portions 26b of the electrical contacts 26 are disposed proximate to the mounting interface 34. In accordance with the illustrated embodiment, the mounting portions 26b extend out, or down along the transverse direction T, with respect to the mounting interface 36. In this regard, the mounting interface 36 can be further defined by the leadframe housings.

The electrical contacts 26 can be supported by the connector housing 24 in any manner as desired. For instance, the electrical connector 22 can include a plurality of leadframe assemblies 38. Each of the leadframe assemblies 38 can include a dielectric or electrically insulative leadframe housing 40 and respective ones of the plurality of the electrical contacts 26 that are supported by the leadframe housing 40. The leadframe housings 40, and thus the leadframe assemblies 38, are configured to be supported by the connector housing 24. Thus, it can be said that the electrical contacts 26 are supported by the connector housing 24. The leadframe assemblies 38 can be supported by the connector housing 24 such that the leadframe assemblies 38 are disposed adjacent each other along the lateral direction A. The leadframe assemblies 38 can be configured as insert molded leadframe assemblies (IMLAs) whereby the leadframe housing 40 is overmolded onto the respective plurality of electrical contacts 26. Alternatively, the electrical contacts 26 can be stitched into the leadframe housing 40 or otherwise supported by the leadframe housing 40. The leadframe assemblies 38 can define respective columns of respective ones of the plurality of electrical contacts 26 that are spaced from each other along the lateral direction A. The mating portions 26a of the electrical contacts 26 of each column can be spaced from each other along the transverse direction T.

The columns of the electrical contacts 26 can be defined by the insert molded leadframe assemblies 38, or by the arrangement of electrical contacts as directly supported by the connector housing 24. The mounting portions 26b of the electrical contacts 26 of each column can be spaced from each other along the longitudinal direction L. Each of the leadframe assemblies 38 can define any number of differential signal pairs as desired. In one example, and not by limitation, the leadframe assemblies 38 can include between two differential signal pairs and eight differential signal pairs. The electrical connector 22 any number of leadframe assemblies 38 as desired.

In accordance with the illustrated embodiment, the electrical connector 22 can be constructed as a right-angle connector whereby the mating interface 34 is oriented substantially perpendicular to the mounting interface 36. For instance, the mating interface can be defined by a plane that extends along the transverse direction T and the lateral direction A. The mounting interface 36 can be defined by a plane that extends along the longitudinal direction L and the lateral direction A. Alternatively, the electrical connector 22 can be constructed as a vertical electrical connector whereby the mating interface 34 is oriented substantially parallel to the first mounting interface 36. Similarly, the electrical contacts 26 can be configured as vertical electrical contacts whereby the mating portions 26a are oriented substantially parallel to the mounting portions 26b along the longitudinal direction L.

Referring now to FIGS. 2-3D, and as described above, the electrical connector 22, includes the hold down member 42 that is configured to secure the electrical connector 22 to the substrate 30. In accordance with one embodiment, the connector housing 24 defines a channel 44 that extends into the housing body 32 and is configured to receive the hold down member 42. The hold down member 42 includes a hold down body 43 and at least one aperture 46 that extends at least into the hold down body 43. The substrate 30 defines a complementary at least one aperture 48. The hold down member 42 is movable within the channel 44 to a position whereby the at least one aperture 46 is open to and aligned with the complementary at least one aperture 48 of the substrate. Accordingly, a fastener 50 inserted up through the aperture 48 along the transverse direction T extends at least into the aperture 46 of the hold down member 42 so as to secure the hold down member 42, and thus the connector housing 24, and thus the electrical connector 22, to the substrate 30. For instance, the channel 44 is sized and configured to receive the hold down member 42 such that the hold down member 42 is slidable along the longitudinal direction L in the channel 44 between a first position whereby the aperture 46 is out of alignment with the complementary aperture 48 with respect to the transverse direction T, and a second position whereby the aperture 46 is in alignment with the complementary aperture 48 with respect to the transverse direction T. Thus, when the hold down member 42 is in the second position, the at least one fastener 50 is insertable through the aperture 48 of the substrate 30 and into the at least one aperture 46 of the hold down member 42 so as to secure the connector housing 24 to the substrate 30. The electrical connector assembly 20 can include the electrical connector 22, the substrate 30, and the at least one fastener 50.

The channel 44 can be elongate along a direction of elongation that is parallel to the mounting interface 36. The hold down member 42 is slidable in the channel 44 along the direction of elongation between the first and second positions. For instance, the channel 44 can be elongate along the longitudinal direction L, though it is appreciated that the channel 44 can be elongate along any direction as desired. The channel 44 can be asymmetrical in cross-section so as to slidably receive the hold down member 42 only when the hold down member 42 is in a predetermined orientation with respect to the connector housing 24 so as to fit into the channel 44. The channel 44 can define an opening 45 that receives the hold down member 42. Thus, the hold down member 42 can be inserted into the channel 44, and thus into the connector housing 24, through the opening 45, and removable from the channel 44, and thus the connector housing 24, out the opening 45.

For instance, the housing body 32, and thus the connector housing 24, can define a rear surface 52 that is opposite the mating interface 34. The mounting interface 36 extends along a direction between the rear surface 52 and the mating interface 34. The rear surface 52 can define the opening 45. The channel 44 can thus extend from the opening 45 in the forward mating direction. Accordingly, the hold down member 42 can be inserted into the channel 44 in the forward mating direction.

The channel 44 is elongate along a respective length, and the hold down member 42 is elongate along a respective length. The length of the channel 44 can be equal to or greater than the length of the hold down member 42, or alternatively can be less than the length of the hold down member 42. At least a portion of the channel 44 can be open to the mounting interface 36, and thus open with respect to the substrate 30, such that the fastener 50 can extend through the mounting interface 36 and into the hold down member 42. Otherwise stated, at least a portion of the length of the channel 44, for instance an entirety of the length of the channel 44, can extend through the mounting interface 36.

The housing body 32 defines a first inner surface 54 that defines a first portion of the channel 44, and a second inner surface 49 that defines a second portion of the channel 44. The first inner surface 54 can be an upper surface, and the second inner surface 49 can be a lower surface that is opposite the upper surface along the transverse direction T. Accordingly, the hold down member 42 is slidably captured between the first inner surface 54 and the second inner surface 49. The first inner surface 54 can define a first gap 61. The first gap 61 can define a recess that extends into the housing body 32. The second inner surface 49 can define a second gap 63. For instance, the second gap 63 can be defined by a pair of opposed lips 47. The opposed lips 47 can be spaced from each other along the lateral direction A. The lips 47 define an opening that extends through the second inner surface 49 along the transverse direction T. The lips 47 can be defined by the housing body 32 at the mounting interface 36. Further, at least one or both of the lips 47 can define a surface that is raised toward the first inner surface 54 along the transverse direction T.

The housing body 32 can further define inner side surfaces 55 that are opposite each other in the lateral direction A. The inner side surfaces 55 define a portion of the channel 44. The inner side surfaces 55 can be positioned such that both the first and second gaps 61 and 63 are disposed entirely between the inner side surfaces 55 with respect to the lateral direction A. Further, the first gap 61 can extend along a first distance, and the second gap 63 can extend along a second distance a second distance that is different that is different than the first distance. For instance, the second distance can be greater than the first distance. The first and second distances can be measured in the lateral direction A, or any suitable alternative direction as desired.

The hold down body 43, and thus the hold down member 42, can similarly define first and second opposed outer surfaces 57 and 59. The first outer surface 57 can be an upper surface, and the second outer surface 59 can be a lower surface that is opposite the upper surface along the transverse direction T. The hold down member 42 can further define first and second outer side surfaces 65 that are spaced from each other in the lateral direction A. hold down member 42 can include at least one projection that extends from the hold down body 43 toward the housing body 32 when the hold down member 42 is disposed in the channel 44. The first outer surface 57 can define a first projection 67. The second outer surface 59 can define a second projection 69. The first projection 67 can extend along a first distance. The second projection 69 can extend along a second distance that is different that is different than the first distance. For instance, the second distance can be greater than the first distance. The first and second distances can be measured in the lateral direction A, or any suitable alternative direction as desired. As a result, the hold down member 42 is insertable into the channel 44 only in a predetermined orientation whereby the first projection 67 is received in the first gap 61, and the second projection 69 is received in the second gap 63. The second projection 69 is too big to be received in the first gap 61. Due to the low profile of the hold down member 42, the hold down member 42 can be particularly advantageous in low profile electrical connectors that include a low number of differential signal pairs per column, such as two. It should be appreciated that the hold down member 42 including the projections 67 and 69 can alternatively be used with any electrical connector having any number of differential signal pairs as desired.

At least one or both of the hold down member 42 and the connector housing 24 can define at least one retention member that is configured to restrict movement of the hold down member 42 between the first and second position in the channel 44. The retention member can be configured as a compression member that applies a compression force against the hold down member 42 so as to provide resistance to translation of the hold down member 42 along the channel 44. If a force is applied to the hold down member 42 along the direction of elongation that is less than the resistance, then the compression force will prevent the hold down member 42 from moving along the direction of elongation between the first and second positions. If a force is applied to the hold down member 42 along the direction of elongation that is greater than the resistance, then the compression force will be overcome, and the hold down member 42 will move along the direction of elongation in the direction of the applied force.

In accordance with the example illustrated in FIGS. 3A-4E, the connector housing 24 can define at least one retention member 71 that projects from the housing body 32 into the channel 44. For instance, the at least one retention member can project into the channel 44 from at least one of the surfaces that partially defines the channel 44. In one example, a first retention member 71 can project from the first inner surface 54. A second retention member 71 can also project from the first inner surface 54. The first and second retention members 71 can be positioned such that the first gap 61 is disposed between the first and second retention members 71. Alternatively or additionally, first and second retention members 71 can project from the second inner surface 49 and can be positioned such that the second gap 63 is disposed between the first and second retention members 71. The first and second retention members 71 can be elongate along the direction of elongation of the channel 44.

For instance, the first and second retention members 71 can be elongate along the longitudinal direction L.

When the hold down member 42 is disposed in the channel 44, contact between the at least one retention member 71 of the connector housing 24 and the hold down member can bias the hold down member 42 toward the opposite surface that partially defines the channel 44. Accordingly, when the first and second retention members 71 project from the first inner surface 54, the first and second retention members 71 can bias the hold down member 42 against the second inner surface 49 so as to define the compression force. In particular, the hold down member 42 can be biased against the raised surface of the at least one or both of the lips 47. In this regard, the raised surface can define a force localizer that concentrates the compression force in a small area, thereby increasing the force necessary to overcome the compression force. When the first and second retention members 71 project from the second inner surface 49, the first and second retention members 71 can bias the hold down member 42 against the first inner surface 54 so as to define the compression force. Similarly, when the first and second retention members 71 project from a first one of the inner side surfaces 55, the first and second retention members 71 can bias the hold down member 42 against the other one of the inner side surfaces 55 so as to define the compression force.

In one example, the retention members 71 can be configured as crush ribs. Accordingly, as the hold down member 42 is inserted into the channel 44, the hold down member causes the retention members 71 to fail under compressive loading, which causes the retention members 71 to plastically deform as they are forced by the hold down member to collapse toward the inner surface of the connector housing 24 from which they project into the channel.

As described above, the hold down member 42 includes at least one aperture 46 that extends at least into the hold down body 43. The hold down member 42 can include any number of apertures 46 as desired, such as two or more than two. Thus, the hold down member 42 can define first and second ones of the apertures 46 that extend at least into the hold down body 43. The apertures 46 can be spaced from each other, such that when the hold down member 42 is in the second position, a fastener 50 is insertable through a respective one of the complementary aperture 48 in the substrate 30 and into the aligned one of the apertures 46 of the hold down member 42 so as to further secure the connector housing 24 to the substrate 30. The first and second apertures 46 can be spaced from each other along the direction of elongation, which can be in the longitudinal direction L in accordance with certain examples.

The apertures 46 of the hold down member 42 can be threaded. That is, at least a portion of each of the apertures 46 can be threaded. The fasteners 50 can similarly be threaded. For instance, the fasteners 50 can define a head and a shaft that extends from the head. In one example, the fasteners 50 can be configured as screws, whereby the shaft is threaded. Accordingly, when the hold down member 42 is in the second position, the fasteners 50 can be inserted up through the complementary apertures 48 of the substrate 30 and into the apertures 46 of the hold down member 42. In particular, the threaded shaft can threadedly mate with the threaded apertures 46, respectively. As the fasteners 50 are further threaded in the apertures 46, the head bears against the substrate, thereby applying a compressive force to the substrate 30 between the head of the fasteners 50 and the connector housing 24. Further, the fasteners 50 can apply a retention force that biases the hold down member 42 against the second inner surface 49 of the connector housing 24. The retention force causes a frictional force between the hold down member 42 and the connector housing 24 that prevents movement of the hold down member 42 with respect to the connector hosing 24 when a force consistent with ordinary use is applied to the hold down member 42. Thus, at least a portion up to all of the forces applied to the connector 22 are absorbed at the interface of the hold down member 42 and the connector housing 24, and are not transferred to the interface between mounting portions 26b and the substrate 30. It should be appreciated that the retention force provided by the fasteners 50 is greater than the compression force provided by the at least one retention member.

It should be appreciated that the movability of the hold down member 42 between the first and second positions allows for positional flexibility of the electrical connector 22 when securing the electrical connector 22 to the substrate 30, with respect to conventional electrical connectors who have fixed hold down members. For instance, the electrical connector 22 can be moved from a first position to a second position along the direction of elongation of the channel 44 while the hold down member 42 is in the second position, such that the at least one aperture 46 of the hold down member 42 is aligned with the at least one aperture 48 of the substrate 30. In particular, the hold down member 42 can translate within the channel 44 as the electrical connector 22 is moved from the first position to the second position with respect to the underlying substrate 30 until the mounting portions 26b are aligned with the respective contact locations of the substrate 30.

Referring now to FIG. 3D, it should be appreciated that the apertures 46 can extend from the second outer surface 59 along a direction toward the first outer surface 57. For instance, the direction can be the transverse direction T. For instance, the apertures 46 can extend from the second outer surface 59 to the first outer surface 57. Alternatively, the apertures 46 can extend from the second outer surface 59 toward the first outer surface 57, but can terminate prior to reaching the second outer surface 59. In particular, the apertures 46 can extend from the second projection 69 along a direction toward the first projection 67. In one example, the apertures 46 can be stepped. For example, the apertures 46 can define a first cross section from the second outer surface 59 toward the first outer surface 57 The apertures 46 can define a second cross section from the first cross section toward, for instance to, the first outer surface 57. The second cross section can be less than the first cross section. The hold down member can include a shoulder that defines the second cross section. Accordingly, the fasteners 50 can be sized to be received in the first cross section, and sized too large to be received in the second cross section. The fasteners 50 can have a length sufficient such that the shaft terminates in the first cross section when the fasteners 50 secure the substrate 30 to the connector housing 24.

While the apertures 46 can be threaded as described above, the apertures 46 can alternatively be unthreaded. The fasteners 50 can be thread forming, such that the shafts include thread cutting members that are configured to create threads of the hold down member 42 in the apertures 46. For instance, the thread forming fasteners 50 are configured to be inserted through the apertures 48 of the substrate and into the apertures 46 of the hold down member 42. Rotation of the fasteners 50 causes the shafts to create threads in the inner surface of the hold down member 42 that defines the apertures 46. The fasteners 50 can be rotated until the head of the fasteners 50 secures the substrate 30 to the electrical connector 22 in the manner described above.

Alternatively still, the fastener 50 can be configured as what is known as a push pin rivet that can be inserted into the aperture 48 of the substrate and subsequently into the aperture 46 of the hold down member 42. A post, which can be a central post, can be biased distally, which causes the rivet to expand in the aperture 46, thereby fixing the rivet to the substrate and the hold down member 42, securing the substrate to the hold down member.

Alternatively still or additionally, the connector housing 24 can further define at least one aperture that extends into the housing body 32 and is open to the channel 44 such that the at least one aperture of the connector housing aligned with the at least one aperture 46 of the hold down member 42 when the hold down member 42 is in the second position. For example, the at least one aperture that extends into the housing body 32 can extend into the first inner surface 54. The at least one aperture of the connector housing 24 comprises a circumscribed hole, or an elongate slot, which can be elongate in the longitudinal direction L. Accordingly, when he hold down member is in the second position, the at least one fastener 50 can be configured to extend through the complementary aperture 48 of the substrate 30, through the at least one aperture 46 of the hold down member 42, and into the at least one aperture of the connector housing 24. The at least one aperture of the connector housing 24 can threaded, such that the threaded shaft of the at least one fastener 50 threadedly mates with the at least one aperture of the connector housing 24 so as to provide the compressive force described above. In this regard, it should be appreciated that the at least one aperture 46 of the hold down member 42 can be unthreaded. In this regard, it should be appreciated that the fastener 50 can be constructed in accordance with any suitable embodiment as desired so as to secure the hold down member 42, and thus the electrical connector, to the substrate 30.

Figure 5A:
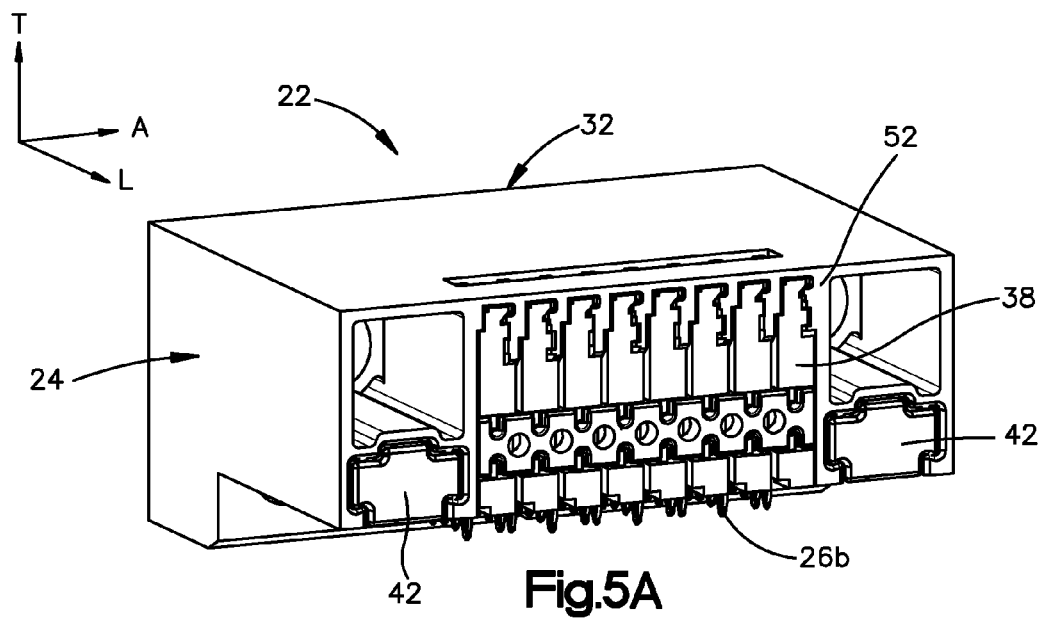
FIG. 5A is a perspective view of an electrical connector similar to the electrical connector illustrated in FIG. 2, but including a pair of hold down members.
Figure 5B:
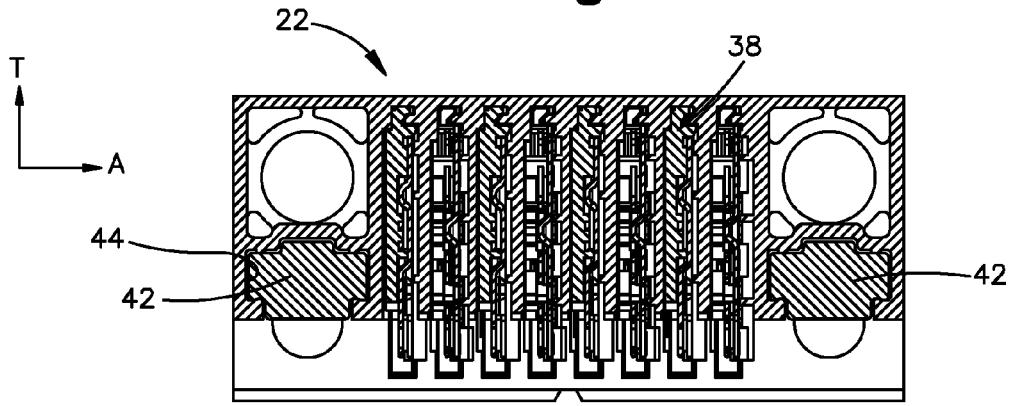
FIG. 5B is rear end elevation view of the electrical connector illustrated in FIG. 5A.
Figure 5C:
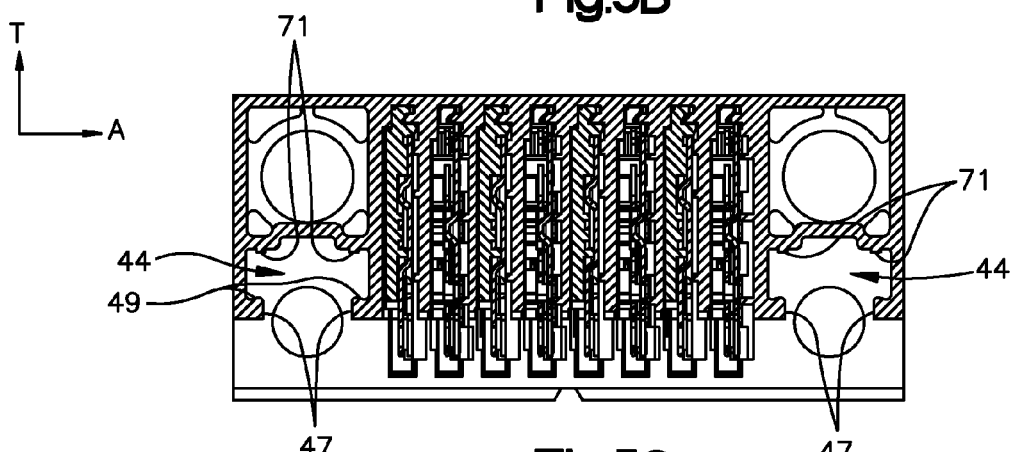
FIG. 5C is a rear elevation view of the electrical connector illustrated in FIG. 5B, shown with the hold down members removed.

It should be appreciated that the channel 44, and thus the hold down member 42, can be located at any location of the electrical connector 22 as desired. For instance, from a rearward view with the mounting portions 26b extending from the connector housing 24 in a downward direction, the channel 44, and thus the hold down member 42, can be disposed at a left side of the electrical connector 22. For instance, the channel 44, and thus the hold down member 42, can be disposed adjacent an exterior left side wall surface of the connector housing 24 with respect to the lateral direction A. Alternatively, from a rearward view with the mounting portions 26b extending from the connector housing 24 in a downward direction, the channel 44, and thus the hold down member 42, can be disposed at a right side of the electrical connector 22. For instance, the channel 44, and thus the hold down member 42, can be disposed adjacent an exterior right side wall surface of the connector housing 24 with respect to the lateral direction A. Alternatively, as illustrated at FIGS. 5A-5C, the electrical connector 22 can include first and second ones of a pair of the channels 44 and respective first and second ones of a pair of the hold down members 42 that are configured to be inserted into the first and second channels 44, respectively, in the manner described above. From a rearward view with the mounting portions 26b extending from the connector housing 24 in a downward direction, the first one of the channels 44 and thus the first one of the hold down members 42 can be disposed at a left side of the electrical connector 22. For instance, from a rearward view with the mounting portions 26b extending from the connector housing 24 in a downward direction, the first one of the channels 44 and thus the first one of the hold down members 42 can be disposed adjacent an exterior left side wall surface of the connector housing 24 with respect to the lateral direction A. Further, from the rearward view with the mounting portions 26b extending from the connector housing 24 in a downward direction, the second one of the channels 44 and thus the second one of the hold down members 42 can be disposed at a right side of the electrical connector 22. For instance, from the rearward view with the mounting portions 26b extending from the connector housing 24 in a downward direction, the first one of the channels 44 and thus the first one of the hold down members 42 can be disposed adjacent an exterior right side wall surface of the connector housing 24 with respect to the lateral direction A. Thus, the leadframe assemblies 38 can be disposed between the first and second channels 44, and thus between the first and second hold down members 42, with respect to the lateral direction A. The hold down members 44, and thus the connector housing, can be attached to the underlying substrate 30 as described herein. Further, the first and second hold down members 44 and the connector housing 24 can be constructed in accordance with any embodiment described herein.

Figure 6A:
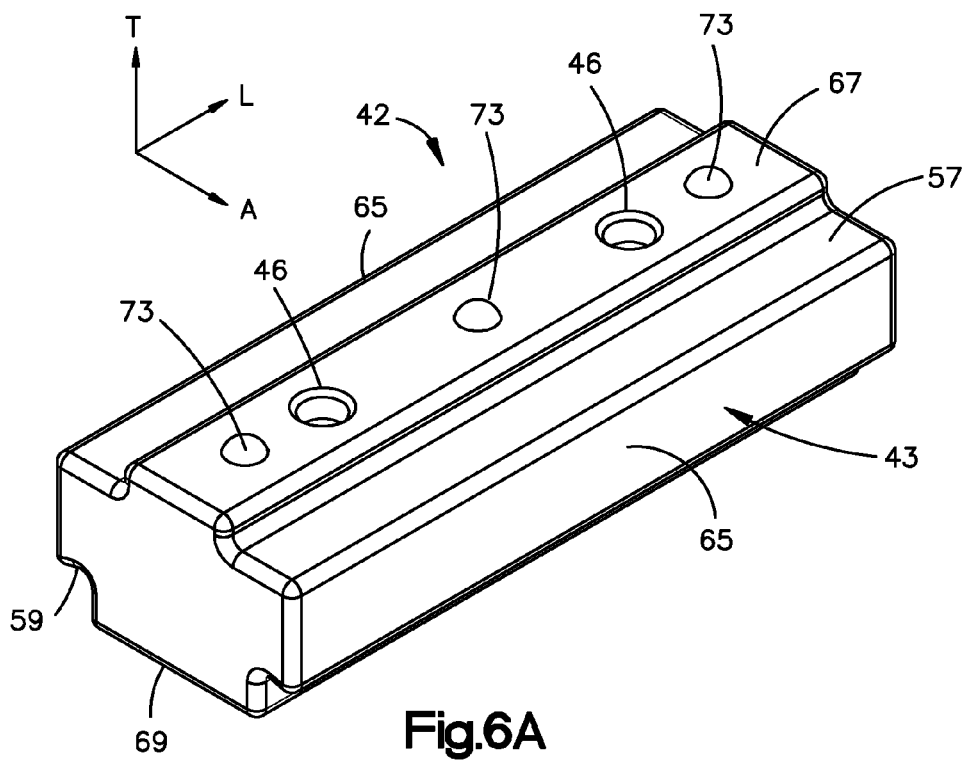
FIG. 6A is a perspective view of a hold down member constructed in accordance with an alternative embodiment.
Figure 6B:
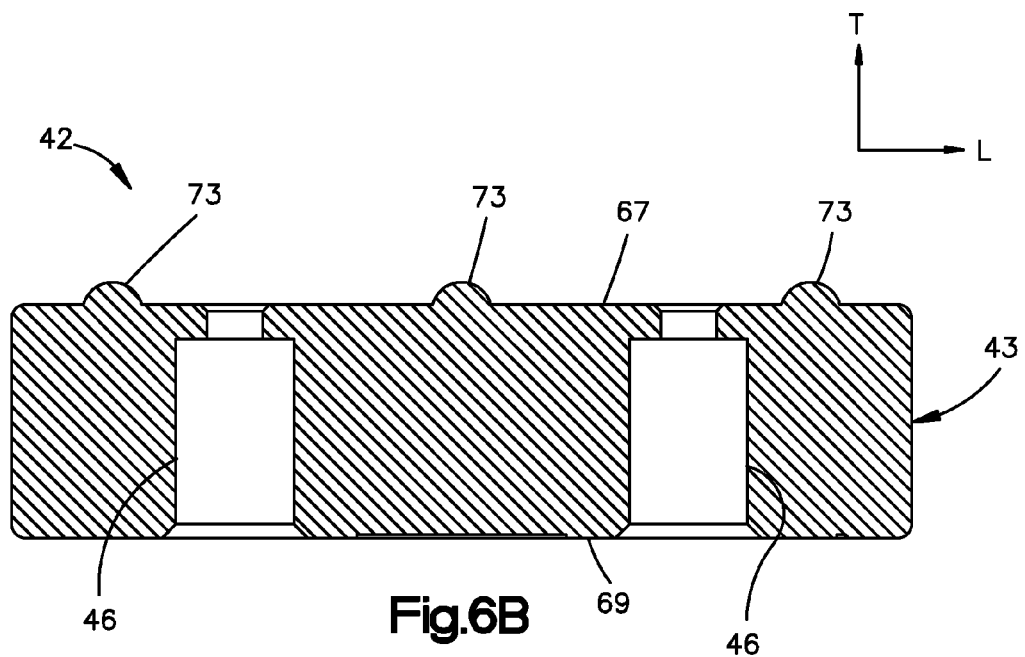
FIG. 6B is a sectional side elevation view of the hold down member illustrated in FIG. 6A.
Figure 7:
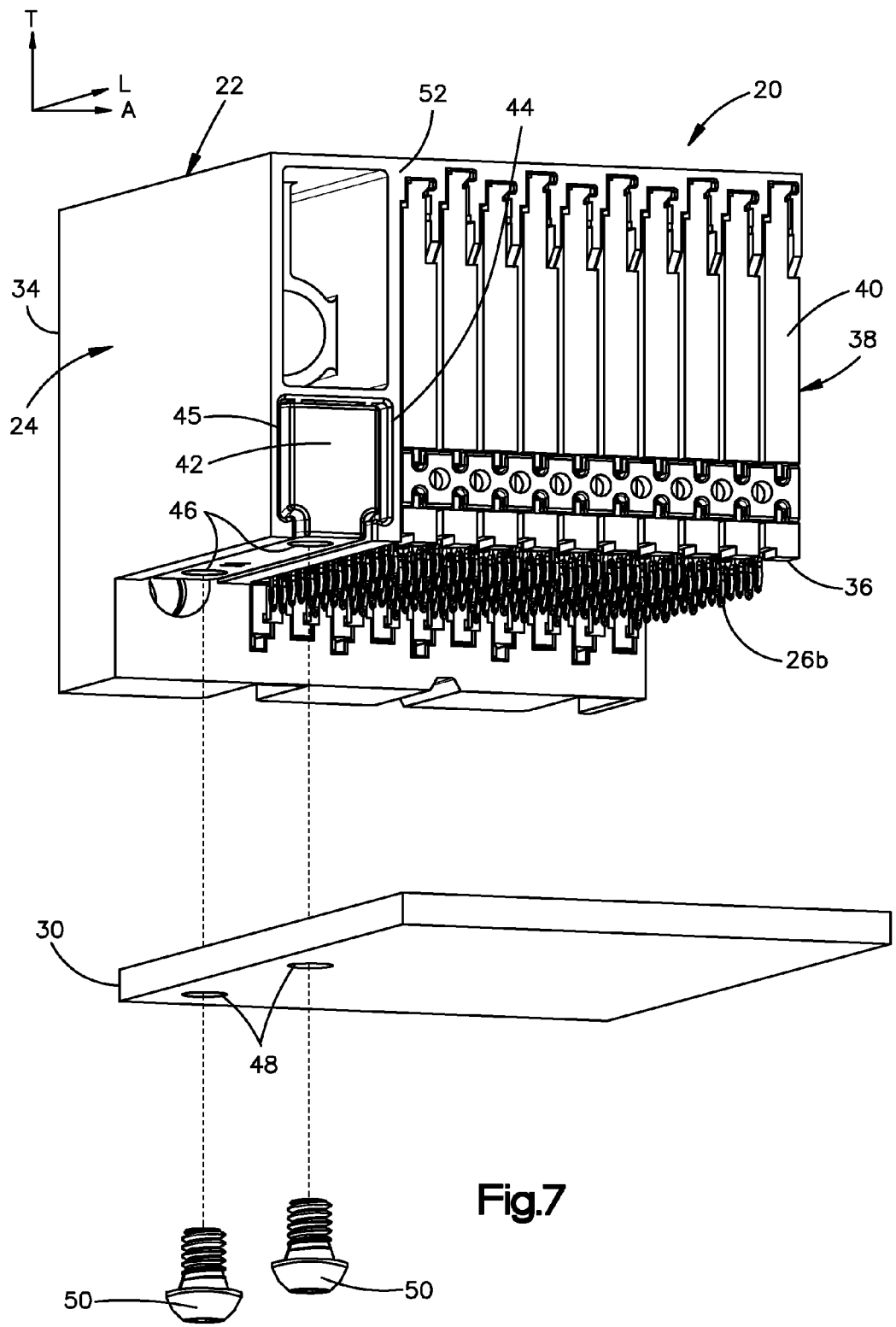
FIG. 7 is an exploded perspective view of an electrical connector assembly constructed in accordance with another embodiment, including an electrical connector, a substrate, and a fastener.
Figure 10:
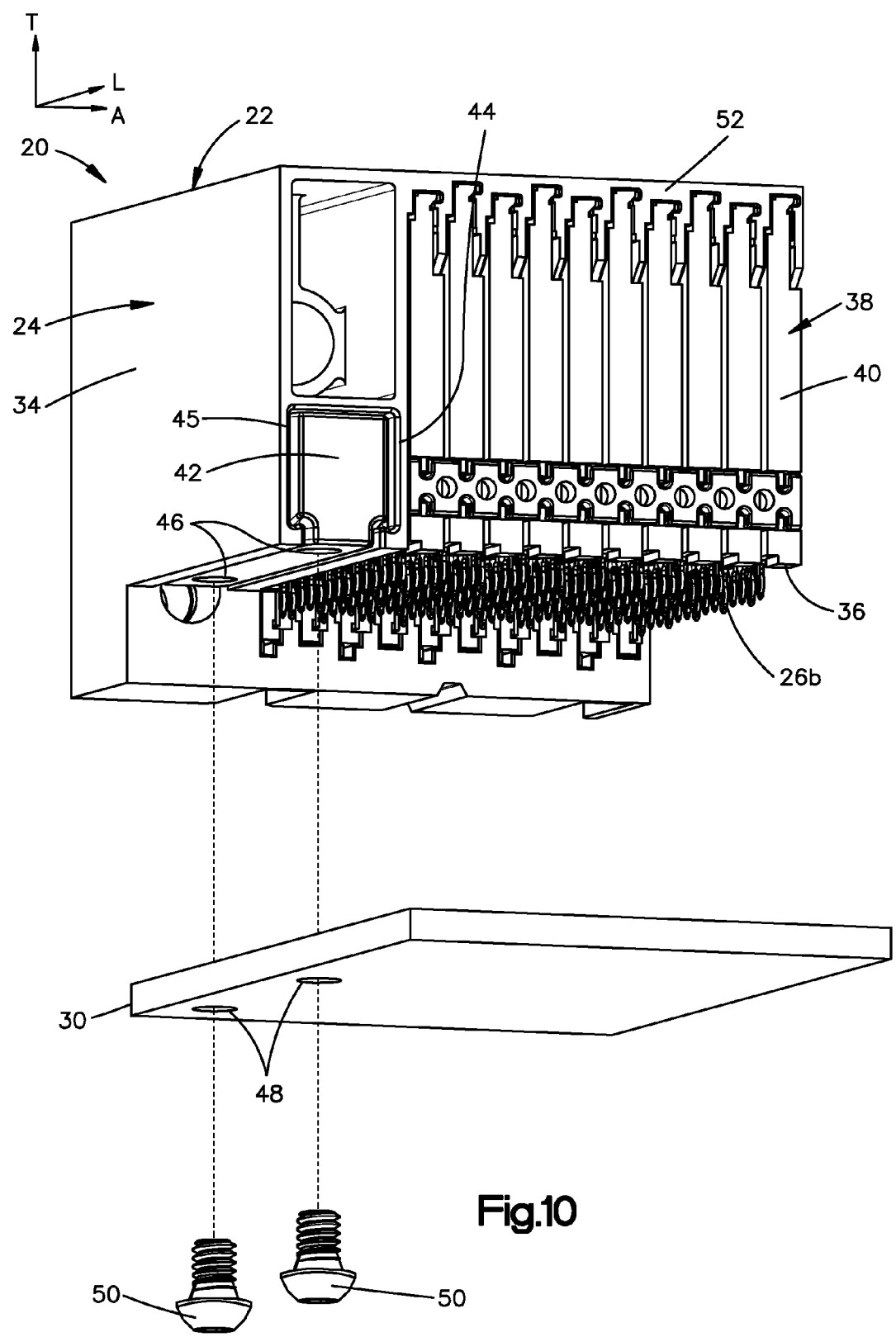
FIG. 10 is an exploded perspective view of an electrical connector assembly constructed in accordance with another embodiment, including an electrical connector, a substrate, and a fastener.
Figure 12A:
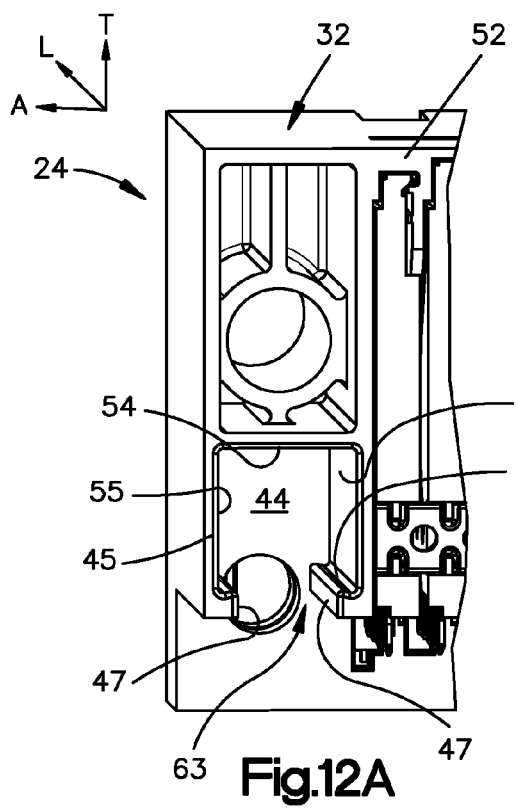
FIG. 12A is a perspective view of a portion of the electrical connector illustrated in FIG. 10, showing a channel configured to receive the hold down member.
Figure 12B:
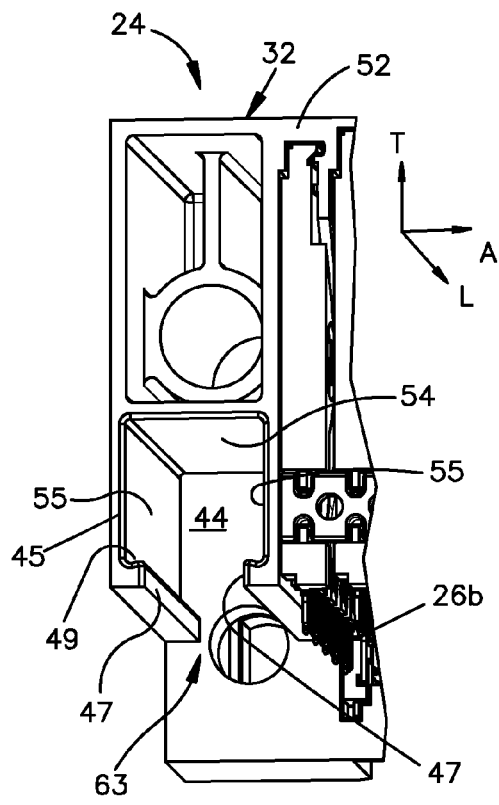
FIG. 12B is another perspective view of a portion of the electrical connector illustrated in FIG. 12A, showing the channel.
Figure 12C:
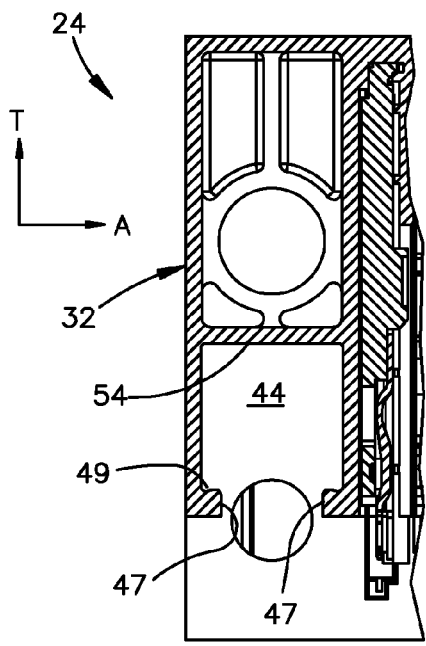
FIG. 12C is a sectional end elevation view of a portion of the electrical connector, showing the channel illustrated in FIG. 12B.
Figure 12D:
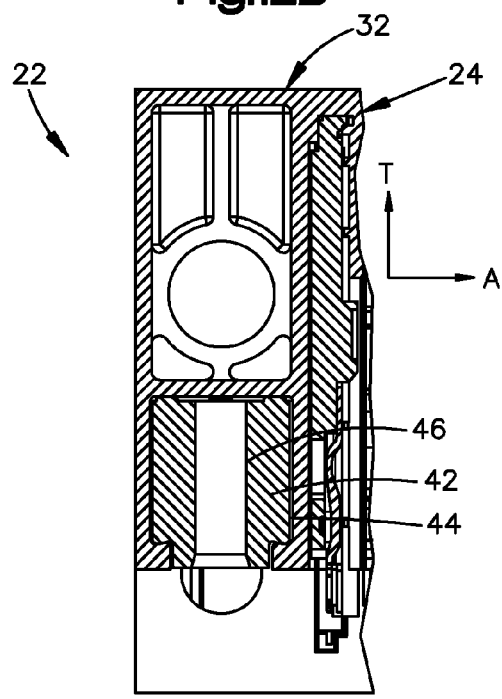
FIG. 12D is a sectional end elevation view of a portion of the electrical connector, showing the hold down member inserted into the channel illustrated in FIG. 12C.

Referring now to FIGS. 6A-6B, and as described above, at least one or both of the hold down member 42 and the connector housing 24 can define at least one retention member that is configured to restrict movement of the hold down member 42 between the first and second position in the channel 44. The connector housing 24 can include the at least retention member 71 as described above. Alternatively or additionally, the hold down member 42 can include at least one retention member 73 that is defined as a projection. For instance, the at least one retention member 73 can project out from at least one of the outer surfaces of the hold down member 42. The at least one retention member 73 can be round or define any suitable alternative shape as desired. In one example, the at least one retention member 73 can project out from the first outer surface 57. Alternatively or additionally, the at least one retention member 73 can project out from the second outer surface 59. Alternatively or additionally still, the at least one retention member 73 can project out from one or both of the outer side surfaces 65.

In one example, the at least one retention member 73 can be disposed adjacent the at least one aperture 46 of the hold down member 42. The retention member 73 can be configured to contact the housing body 32 when the hold down member 42 is positioned in the channel, such that contact between the at least one retention member 73 of the hold down member 42 and the connector housing 24 can bias the hold down member 42 toward the opposite surface that partially defines the channel 44. Accordingly, when the at least one retention member 73 projects from the first outer surface 57 and contacts the first inner surface 54, the at least one retention member 73 can bias the hold down member 42 against the second inner surface 49 so as to define the compression force. For instance, the at least one retention member 73 can extend out from the first projection 67 of the first outer surface 57. In one example, the hold down member 42 can include a plurality of retention members 73 that can be arranged at any suitable location as desired. For instance, the retention members 73 can be alternatingly arranged with the apertures 46. While three retention members 73 are illustrated, it should be appreciated that the hold down member 42 can include any number of retention members 73 as desired. Similarly, when the at least one retention member 73 projects from the second outer surface 59, the at least one retention member 73 can bias the hold down member 42 against the first inner surface 54 so as to define the compression force. Similarly, when the at least one retention member 73 projects from a first one of the outer side surfaces 65 on one side of the channel 44, the at least one retention member 73 can bias the hold down member 42 against one of the inner side surfaces 55 at the other side of the channel 44 so as to define the compression force.

Referring now to FIGS. 7-9D, it should be appreciated that the hold down member 42 and the channel 44 can define any suitable asymmetrical shape as desired such that the channel 44 slidably receives the hold down member 42 only when the hold down member 42 is in a predetermined orientation with respect to the connector housing 24. For instance, one of the first and second inner surfaces 54 and 49 can define a respective gap, while the other of the first and second inner surfaces 54 and 49 can be substantially flat with respect to the lateral direction A along its length. By substantially flat, it is meant that the other of the first and second surfaces does not define a gap that receives a complementary projection of the hold down member 42 that orientates the hold down member 42 with respect to the connector housing 24. In accordance with one embodiment, the first inner surface 54 can be substantially flat, and the second inner surface 49 can define the gap 63 as described above.

Similarly, it should be appreciated that one of the first and second outer surfaces 57 and 59 can define a projection, while the other of the first and second outer surface 57 and 59 can be substantially flat with respect to the lateral direction A along its length. By substantially flat, it is mean that the other of the first and second outer surfaces 59 does not define a projection that is received in a complementary gap of the connector housing 24 that orientates the hold down member 42 with respect to the connector housing 24. In accordance with one embodiment, the first outer surface 57 can be substantially flat, and the second outer surface 59 can define the projection 69 as described above. Accordingly, when the hold down member 42 is in the predetermined orientation with respect to the housing, the projection 69 is received into the gap 63. When the hold down member 42 is in an orientation other than the predetermined orientation, the projection 69 interferes with the connector housing 24 such that the hold down member 42 is prevented from traveling along the channel to the second position. It is recognized that the hold down member 42 having the substantially flat outer surface can have a greater height than the hold down member having both projections 67 and 69. Accordingly, the hold down member 42 having the substantially flat outer surface can be particularly advantageous in electrical connectors having three or more differential signal pairs per column.

Further, it should be appreciated that the apertures 46 can be sized and shaped as desired. Accordingly, while the apertures 46 can define the first and second cross sections as described above, the apertures 46 can alternatively define a constant cross section along an entirety of its length. The constant cross section can be sized to engage the fasteners 50 in the manner described above. The increased profile of the hold down member 42 having the substantially flat outer surface can allow the apertures 46 to have a greater length in the transverse direction T, thereby increasing the thread engagement length with the fasteners 50. As illustrated in FIGS. 7-9D, the connector housing 24 can define at least one retention member 71 that projects from the housing body 32 into the channel 44 as described above with respect to FIGS. 1-4D. For instance, the at least one retention member 71 can project from one of the first and second inner surfaces 54 and 49 into the channel 44. Accordingly, the at least one retention member 71 can contact the substantially smooth outer surface 57 of the hold down member 42 so as to bias the hold down member 42 toward the opposed inner surface of the housing body 32, thereby producing the compression force described above. In one example, the at least one retention member 71 can project from the first inner surface 54, and contacts the first outer surface 57 so as to bias the hold down member 42 against the second inner surface 49.

Referring now to FIGS. 10-12D, the hold down member 42 can define the asymmetrical shape as illustrated and described above with respect to FIGS. 7-9D. Further, the hold down member 42 can define at least one retention member 73 that projects out from at least one of the outer surfaces of the hold down member 42 as described above. For instance, the at least one retention member 73 can project out from the substantially flat outer surface, which can be defined by the first outer surface 57 as described above. Accordingly, the at least one retention member 73 can contact the substantially smooth first inner surface 54 of the connector housing 24 so as to bias the hold down member 42 toward the opposed inner surface of the housing body 32, thereby producing the compression force described above.

It should be appreciated that methods can be provided for mounting the electrical connector 22 to the substrate 30. One method can include the step of placing the mounting portions 26b of the electrical contacts 26 in electrical communication with the substrate 30, and inserting the hold down member 42 into the channel 44 as described above. The inserting step can be performed before or after the placing step. The inserting step can further include the step of bringing the at least one retention member of one or both of the connector housing 24 and the hold down member 42 against the other of the connector housing 24 and the hold down member 42, so as to provide the compression force as described above. The inserting step can also include the step of preventing insertion of the hold down member 42 into the channel 44 unless the hold down member 42 is in the predetermined orientation with respect to the connector housing 24. The method can further include the step of moving hold down member 42 along the channel 44 from the first position to the second position. The method can further include the step of driving the at least one fastener 50 through the complementary aperture 48 of the substrate 30 and at least into the aligned at least one aperture 46 of the hold down member 42. For instance, the driving step can include the step of threadedly mating the at least one fastener 50 in the aligned at least one aperture 46 of the hold down member 42 so as to compress the connector housing 24 against the substrate 30. Thus, the connector housing can be captured between the substrate 30 and the hold down member 42. The at least one aperture 46 of the hold down member 42 can be threaded, and the fastener 50 can be similarly threaded, such that the driving step can include the step of threadedly mating the at least one fastener 50 in the aligned at least one aperture 46 of the hold down member 42 so as to compress the connector housing 24 against the substrate 30.

The foregoing description is provided for the purpose of explanation and is not to be construed as limiting the invention. While various embodiments have been described with reference to preferred embodiments or preferred methods, it is understood that the words which have been used herein are words of description and illustration, rather than words of limitation. Furthermore, although the embodiments have been described herein with reference to particular structure, methods, and embodiments, the invention is not intended to be limited to the particulars disclosed herein. Those skilled in the relevant art, having the benefit of the teachings of this specification, may effect numerous modifications to the invention as described herein, and changes may be made without departing from the spirit and scope of the invention, for instance as set forth by the appended claims.

What is claimed:

1. An electrical connector comprising:
a dielectric connector housing including a housing body, the housing defining a channel that extends into the housing body;
a plurality of electrical contacts supported by the housing body such that the electrical contacts define respective mating portions and mounting portions opposite the mating portions, wherein the mating portions are configured to mate with complementary electrical contacts of a complementary electrical component, and the mounting portions are configured to be placed in electrical communication with a substrate when the electrical connector is mounted to the substrate; and
a hold down member including a hold down body and at least one aperture that extends at least into the hold down body, wherein the hold down member is slidably disposed in the channel between a first position whereby the aperture is out of alignment with a complementary aperture in the substrate, and a second position whereby the aperture is in alignment with the complementary aperture,
wherein when the hold down member is in the second position, at least one fastener is insertable through the aperture in the substrate and into the at least one aperture of the hold down member so as to secure the connector housing to the substrate.

2. The electrical connector as recited in claim 1, wherein the housing body defines a mating interface and a mounting interface, the mating portions are disposed proximate to the mating interface, and the mounting portions are disposed proximate to the mounting interface.

3. The electrical connector as recited in claim 1, wherein at least a portion of the channel is open to the mounting interface.

4. The electrical connector as recited in claim 1, wherein the mounting portions extend down with respect to the mounting interface, and the channel extends up into the mounting interface.

5. The electrical connector as recited in claim 1, wherein the mounting interface is perpendicular to the mating interface.

6. The electrical connector as recited in claim 1, wherein one or both of the hold down member and the channel is asymmetric such that the hold down member is receivable in the channel only when the hold down member is in a predetermined orientation with respect to the connector housing.

7. The electrical connector as recited in claim 6, wherein the housing body includes an inner surface that defines a portion of the channel, and a gap that is defined by the inner surface, and the hold down member defines a projection that is slidably received in the gap such that the hold down member is slidably received in the channel.

8. The electrical connector as recited in claim 7, wherein the housing body includes a second inner surface that defines a portion of the channel, and a second gap that is defined by the second inner surface, and the hold down member further defines a second projection sized to be received in the second gap such that the hold down member is slidably received in the channel.

9. The electrical connector as recited in claim 7, wherein the housing body includes a substantially flat inner surface that is disposed opposite the inner surface that defines the recess.

10. The electrical connector as recited in claim 9, wherein the hold down member defines a substantially flat outer surface that is configured to rides along the substantially flat inner surface.

11. The electrical connector as recited in claim 1, wherein the housing body defines a rear surface opposite the mating interface, and the channel is elongate from the rear surface toward the mating interface.

12. The electrical connector as recited in claim 11, wherein the channel is elongate along a direction of elongation that is parallel to the mounting interface.

13. The electrical connector as recited in claim 1, wherein one or both of the connector housing and the hold down member defines at least one retention member that is configured to contact the other of the connector housing and the hold down member so as to bias the hold down member against the connector housing.

14. The electrical connector as recited in claim 13, wherein the hold down member comprises a plurality of retention members each configured to abut the connector housing when the hold down member is disposed in the channel.

15. The electrical connector as recited in claim 13, wherein the connector housing comprises a plurality of retention members that project from an inner surface of the connector housing into the channel, and each of the retention members is configured to abut the hold down member when the hold down member is disposed in the channel.

16. The electrical connector as recited in claim 15, wherein the retention members of the connector housing comprise crush ribs.

17. The electrical connector as recited in claim 1, wherein the at least one aperture of the hold down member is threaded.

* * * * *